(12) United States Patent
Diamond et al.

(10) Patent No.: US 7,863,714 B2
(45) Date of Patent: Jan. 4, 2011

(54) MONOLITHIC MEMS AND INTEGRATED CIRCUIT DEVICE HAVING A BARRIER AND METHOD OF FABRICATING THE SAME

(75) Inventors: Brett M. Diamond, Pittsburgh, PA (US); Matthew A. Zeleznik, Pittsburgh, PA (US)

(73) Assignee: Akustica, Inc., Pittsburgh, PA (US)

( * ) Notice: Subject to any disclaimer, the term of this patent is extended or adjusted under 35 U.S.C. 154(b) by 0 days.

(21) Appl. No.: 11/446,397

(22) Filed: Jun. 5, 2006

(65) Prior Publication Data
US 2008/0006889 A1 Jan. 10, 2008

(51) Int. Cl.
*H01L 23/552* (2006.01)
(52) U.S. Cl. ............... 257/660; 257/414; 257/499; 438/149; 438/606
(58) Field of Classification Search ............ 257/660, 257/499, 500, 501, 414–420; 438/606, 106
See application file for complete search history.

(56) References Cited

U.S. PATENT DOCUMENTS

| | | | |
|---|---|---|---|
| 6,291,875 B1 * | 9/2001 | Clark et al. ............... 257/622 |
| 6,509,622 B1 | 1/2003 | Ma et al. ............... 257/483 |
| 6,781,231 B2 | 8/2004 | Minervini ............... 257/704 |
| 6,853,067 B1 * | 2/2005 | Cohn et al. ............... 257/704 |
| 7,012,327 B2 * | 3/2006 | Huff et al. ............... 257/686 |
| 7,087,496 B2 | 8/2006 | Gutierrez ............... 438/294 |
| 2002/0096760 A1 * | 7/2002 | Simelgor et al. ............... 257/723 |
| 2003/0015768 A1 * | 1/2003 | Bosco et al. ............... 257/528 |
| 2004/0016995 A1 * | 1/2004 | Kuo et al. ............... 257/678 |
| 2004/0097066 A1 * | 5/2004 | Ozgur ............... 438/619 |
| 2004/0157426 A1 * | 8/2004 | Ouellet et al. ............... 438/618 |
| 2004/0245586 A1 * | 12/2004 | Partridge et al. ............... 257/414 |
| 2005/0227493 A1 | 10/2005 | Lin et al. ............... 438/700 |
| 2008/0019015 A1 * | 1/2008 | Fernandez et al. ............... 359/666 |

* cited by examiner

*Primary Examiner*—Fernando L Toledo
(74) *Attorney, Agent, or Firm*—Kenyon & Kenyon LLP

(57) ABSTRACT

An integrated circuit device includes a semiconductor die, the semiconductor die including a semiconductor substrate, driving/control circuitry disposed along a peripheral region of the semiconductor die, a MEMS device disposed within a central region of the semiconductor die, and a barrier disposed between the driving/control circuitry and the MEMS device.

52 Claims, 7 Drawing Sheets

MONOLITHIC MEMS AND INTEGRATED CIRCUIT DEVICE HAVING A BARRIER AND METHOD OF FABRICATING THE SAME

BACKGROUND OF THE INVENTION

1. Field of the Invention

The present invention relates to a device comprising an integrated circuit and integrated MEMS structure that uses a barrier to prevent transmission of environmental and process contaminants, and a method of fabricating an integrated circuit and MEMS device using a barrier to prevent transmission of contaminants.

2. Discussion of the Related Art

In general, MEMS devices use either a sensor device with sensing circuitry or an actuation device with drive circuitry to detect or produce physical phenomenon. In one embodiment, the MEMS device is formed having a sensor device that makes use of a moveable membrane, and the sensing circuitry is commonly formed using typical semiconductor-type fabrication processes. In a typical integrated circuit, the circuitry is formed on a die and a seal ring barrier is formed along outer edges of the die to prevent contamination of the circuitry. Although underlying oxide/nitride layers may be exposed to various environmental and process contaminants during the die singulation process, the seal ring barrier prevents any of the contaminants from contaminating the circuitry.

In addition, incorporation of MEMS devices and associated driving/sensing circuitry on a single die requires formation of a barrier in order to prevent ionic contaminant migration from the MEMS device, as well as moisture and contaminants from the surrounding atmosphere, to the circuitry. Specifically, ionic contaminants and moisture may adversely affect electrical properties of the circuit components and cause changes in circuit performance relative to contamination levels, thereby rendering the integrated circuit/MEMS device inoperable. Accordingly, a barrier is required to physically separate the MEMS device from the driving/sensing circuitry that may allow for passage of electrical signals and at the same time prevent migration of contaminants into the MEMS device.

SUMMARY OF THE INVENTION

Accordingly, the present invention is directed to a monolithic device having both a MEMS device and driving/sensing circuitry monolithically formed on a semiconductor die that provides improved lifetime performance and prevents contaminant migration, and a method of fabricating a monolithic device having both a MEMS device and driving/sensing circuitry unitarily formed on a semiconductor die that provides improved lifetime performance and prevents contaminant migration.

An object of the present invention is to provide a MEMS device and driving/sensing circuitry monolithically integrated on a single semiconductor die.

Another object of the present invention is to provide a structure that prevents migration of contaminants into circuitry monolithically integrated on a single die with a MEMS device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an integrated circuit device includes a semiconductor die, the semiconductor die including a semiconductor substrate, driving/sensing circuitry disposed along a peripheral region of the semiconductor die, a MEMS device disposed within a central region of the semiconductor die, and a barrier disposed between the driving/sensing circuitry and the MEMS device.

In another aspect, a method of fabricating an integrated circuit device includes forming driving/sensing circuitry disposed along a peripheral region of a semiconductor die, the semiconductor die including a semiconductor substrate, forming a MEMS device within a central region of the semiconductor die, and forming a barrier between the driving/sensing circuitry and the MEMS device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
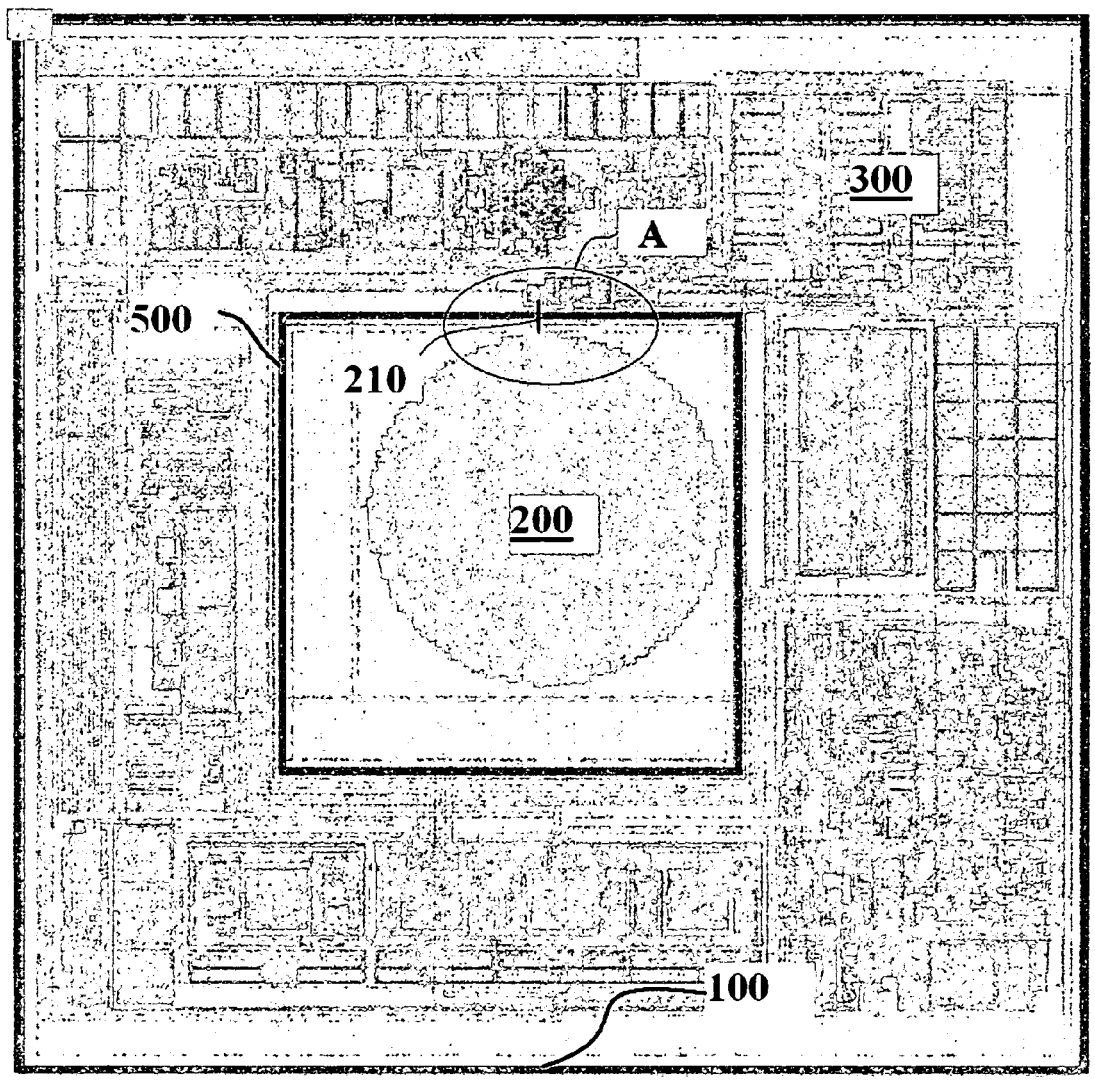
FIG. 1 is a schematic plan view of an exemplary device according to the present invention.

FIG. 1 is a schematic plan view of an exemplary device according to the present invention. In FIG. 1, a device 100 may include a MEMS device 200 and driving/sensing circuitry 300 monolithically integrated onto a single die 100. The MEMS device 200 may be disposed at a central region of the die 100. Alternatively, the MEMS device 200 may be disposed at a location other than the central region of the die 100 to accommodate different design parameters. However, as shown, the MEMS device 200 is disposed in the central region of the die 100 with the driving/sensing circuitry 300 surrounding the MEMS device 200. Here, the MEMS device 200 is electrically connected to the driving/control circuitry 300 by an electrical connection 210. Alternatively, the electrical connection 210 may be provided at other locations with respect to the MEMS device 200, and/or the electrical connection 210 may be provided at a plurality of locations with respect to the MEMS device 200. The MEMS device 200 may include a microphone, speaker(s), inertial sensors, pressure sensors, and RF tunable devices. For example, the MEMS device 200 may include devices that make use of pressure differentials to measure physical, mechanical, and acoustical phenomenon.

In FIG. 1, a barrier 500 is provided between the MEMS device 200 and the surrounding driving/sensing circuitry 300. The barrier 500 is formed to completely surround the MEMS device 200 to prevent any contaminants from migrating into the driving/sensing circuitry 300 from the MEMS device 200, as well as to prevent any moisture or contaminants from the environment external to the MEMS device 200 from migrating into the driving/sensing circuitry 300. Although the barrier 500 is shown having a rectilinear geometry, other geometries may be implemented in order to completely surround the MEMS device 200.

In FIG. 1, the MEMS device 200, the driving/sensing circuitry 300, and the barrier 500 may be formed monolithically on a single semiconductor die. In other words, by using CMOS fabrication techniques and processes, the MEMS device 200, the driving/sensing circuitry 300, and the barrier 500 may be formed during sequential semiconductor fabrication processing to form a complete device on a single semiconductor die. Accordingly, during fabrication, none of the MEMS device 200, the driving/sensing circuitry 300, and the barrier 500 are exposed to environmental contaminants, thereby providing a very efficient fabrication process, as well as a device having reduced exposure to contaminants.

Figure 2:
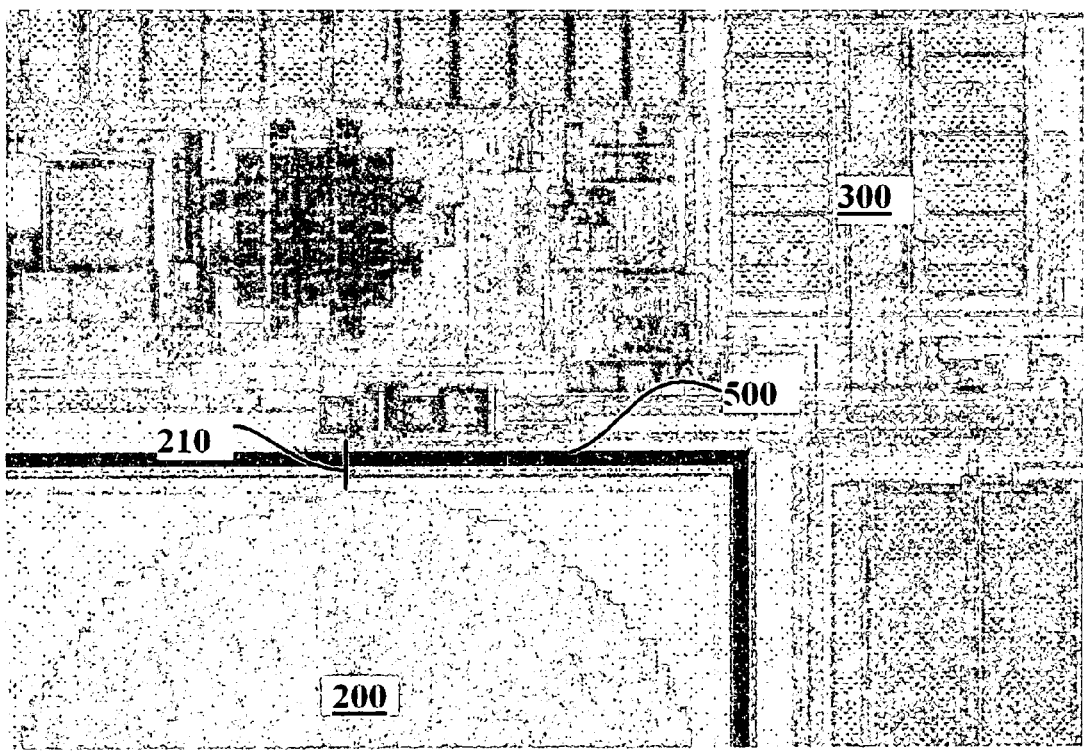
FIG. 2 is an enlarged schematic plan view of region "A" of the exemplary device according to the present invention.

FIG. 2 is an enlarged schematic plan view of region "A" of the exemplary device according to the present invention. In FIG. 2, the barrier 500 may include the electrical connection 210 that electrically interconnects the driving/sensing circuitry 300 to the MEMS device 200.

Figure 3:
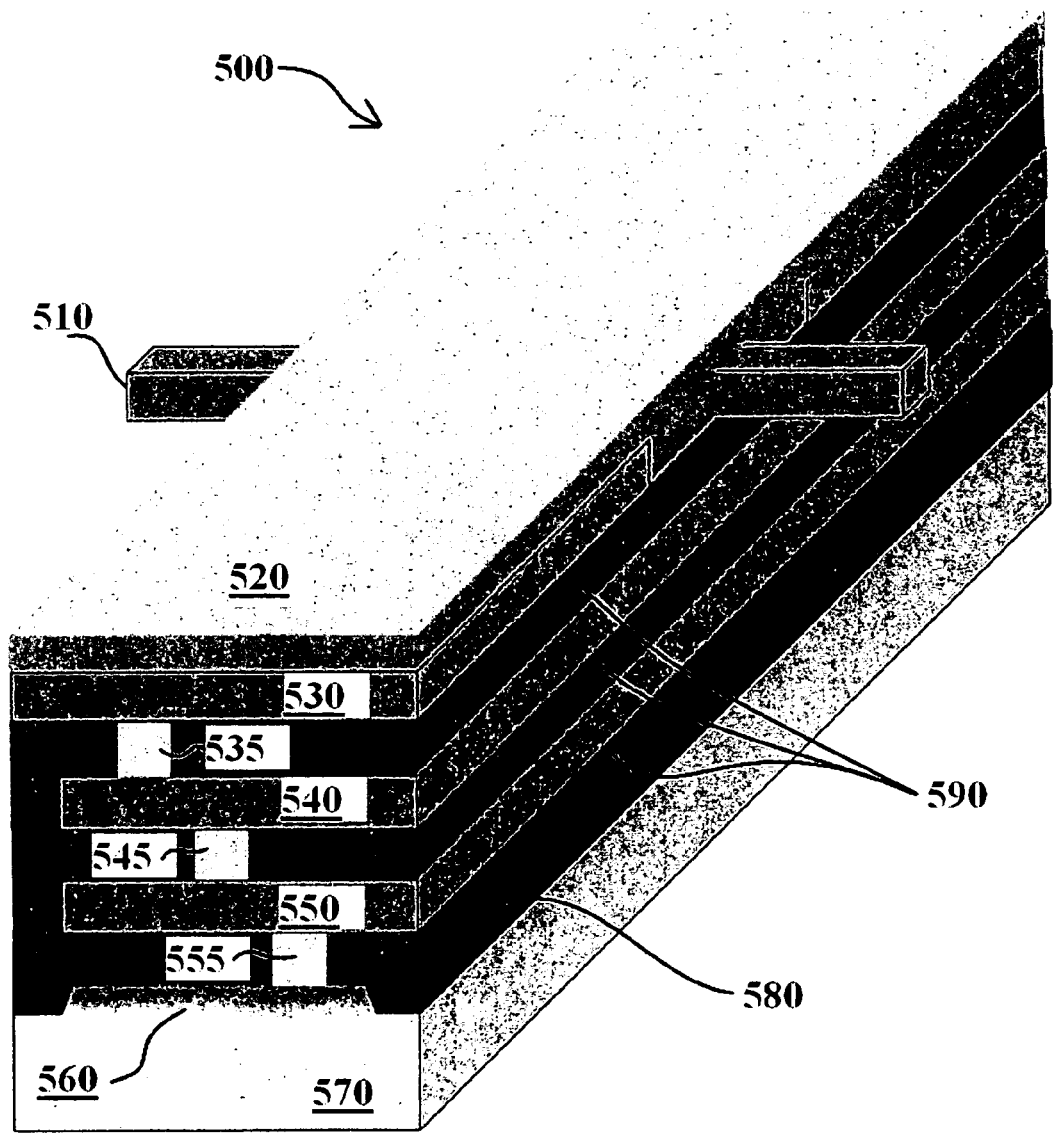
FIG. 3 is a perspective cross sectional view of an exemplary barrier according to the present invention.

FIG. 3 is a perspective cross sectional view of an exemplary barrier according to the present invention. In FIG. 3, a barrier 500 may include a multiple layered structure including interconnecting metal layers 530, 540, and 550, conductive vias 535, 545, and 555, and layers of oxide/nitride material(s) 590 interdispersed between each of the interconnecting metal layers 530, 540, and 550. The barrier 500 further includes a top passivation layer 520, a conductive line 510, and a diffusion region 560 formed within a substrate 570 between field oxide or shallow trench isolation regions 580. Accordingly, the barrier 500, including each of the interconnecting metal layers 530, 540, and 550, the conductive vias 535, 545, and 555, and the diffusion region 560, is formed as a continuous ring encircling the MEMS device 200 (in FIG. 1). Thus, the barrier 500 prevents contaminants and moisture from migrating into the driving/sensing circuitry 300 from the MEMS device 200 (in FIG. 1) by the environment external to the MEMS device 200 (in FIG. 1), while providing electrical contact to the MEMS device 200 (in FIG. 1) by the conductive line 510 formed within the passivation layer 520 in an opening formed in the uppermost interconnecting metal layer 530. Furthermore, the passivation layer 520 prevents infiltration of contaminants and moisture into the MEMS device 200 (in FIG. 1) through a thickness of the barrier 500.

In FIG. 3, the diffusion region 560 may be electrically connected to ground, via the substrate 570, or may be electrically connected to the driving/sensing circuitry 300 (in FIG. 1) via the substrate 570 or via an additional interconnection layer (not shown). Alternatively, the interconnection layers 530, 540, and 550 may be electrically disconnected to the diffuision region 560 by removal of the lowermost conductive via 555.

Figure 4:
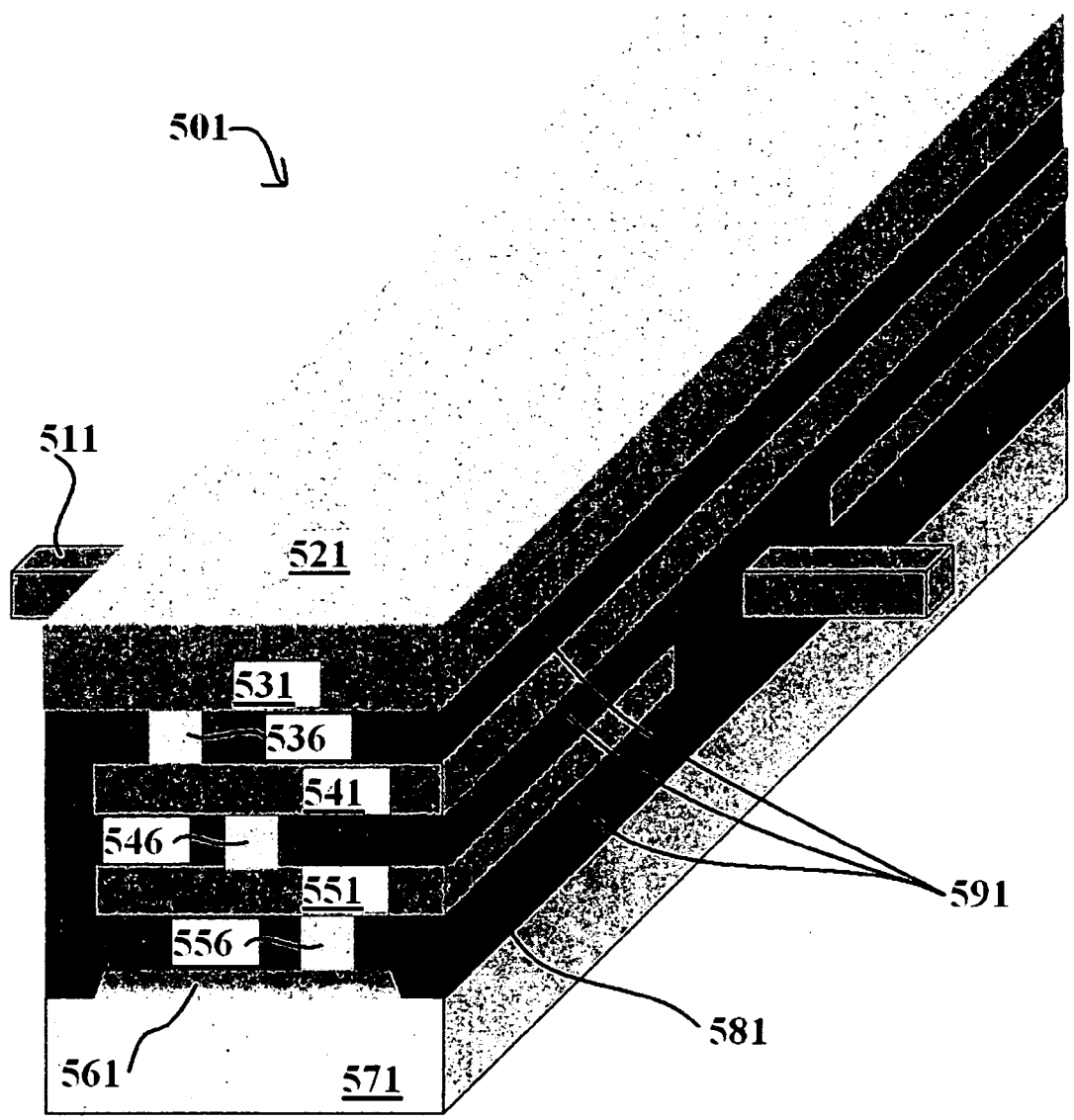
FIG. 4 is a perspective cross sectional view of another exemplary barrier according to the present invention.

FIG. 4 is a perspective cross sectional view of another exemplary barrier according to the present invention. In FIG. 4, a barrier 501 may include a multiple layered structure including interconnecting metal layers 531, 541, and 551, conductive vias 536, 546, and 556, and layers of oxide/nitride material(s) 591 interdispersed between each of the interconnecting metal layers 531, 541, and 551. The barrier 501 further includes a top passivation layer 521, a conductive line 511, and a diffusion region 561 formed within a substrate 571 between field oxide or shallow trench isolation regions 581. Accordingly, the barrier 501, including each of the interconnecting metal layers 531, 541, and 551, the conductive vias 536, 546, and 556, and the diffusion region 561, is formed as a continuous ring encircling the MEMS device 200 (in FIG. 1). Thus, the barrier 501 prevents contaminants and moisture from migrating into the driving/sensing circuitry 300 from the MEMS device 200 (in FIG. 1) by the environment external to the MEMS device 200 (in FIG. 1), while providing electrical contact to the MEMS device 200 (in FIG. 1) by the conductive line 511 formed within the oxide/layers 591 in an opening formed in the lowermost interconnecting metal layer 551. Furthermore, the passivation layer 521 prevents infiltration of contaminants and moisture into the MEMS device 200 (in FIG. 1) through a thickness of the barrier 501.

Figure 5:
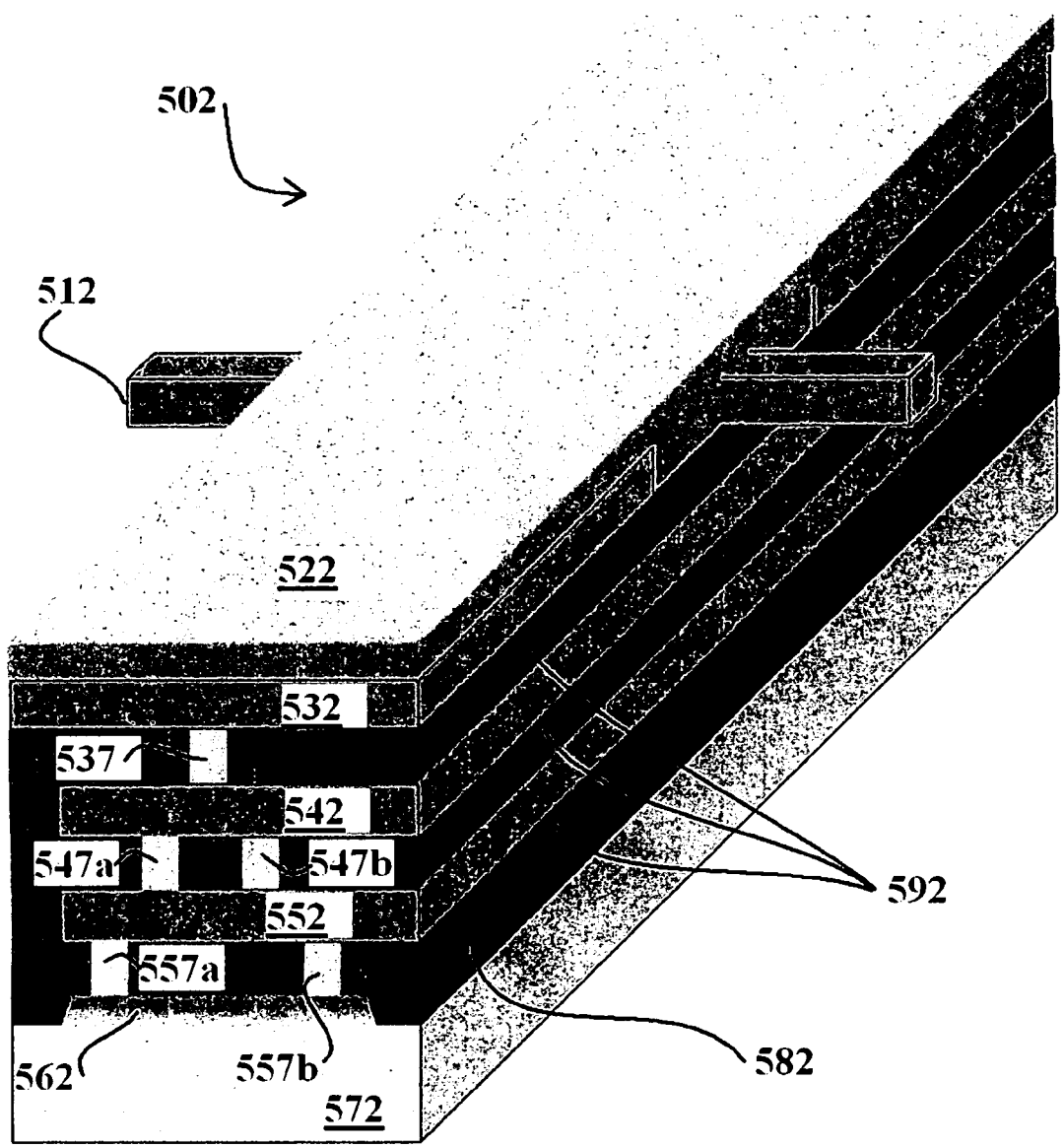
FIG. 5 is a perspective cross sectional view of another exemplary barrier according to the present invention.

FIG. 5 is a perspective cross sectional view of another exemplary barrier according to the present invention. In FIG. 5, a barrier 502 may include a multiple layered structure including interconnecting metal layers 532, 542, and 552, conductive vias 537, 547a/547b, and 557a/557b, and layers of oxide/nitride material(s) 592 interdispersed between each of the interconnecting metal layers 532, 542, and 552. The barrier 502 further includes a top passivation layer 522, a conductive line 512, and a diffusion region 562 formed within a substrate 572 between field oxide or shallow trench isolation regions 582. Accordingly, the barrier 502, including each of the interconnecting metal layers 532, 542, and 552, the conductive vias 537, 547a/547b, and 557a/557b, and the diffusion region 562, is formed as a continuous ring encircling the MEMS device 200 (in FIG. 1). Thus, the barrier 502 prevents contaminants and moisture from migrating into the driving/sensing circuitry 300 from the MEMS device 200 (in FIG. 1) by the environment external to the MEMS device 200 (in FIG. 1), while providing electrical contact to the MEMS device 200 (in FIG. 1) by the conductive line 512 formed within the passivation layer 522 in an opening formed in the uppermost interconnecting metal layer 532. Furthermore, the passivation layer 522 prevents infiltration of contaminants and moisture into the MEMS device 200 (in FIG. 1) through a thickness of the barrier 502.

In FIG. 5, as compared to the exemplary embodiments shown in FIGS. 3 and 4, two conductive vias 547a and 547b are provided to electrically interconnect the middle interconnecting metal layer 542 and the lowermost interconnecting metal layer 552. Accordingly, the contact resistance between the middle and lowermost interconnection metal layers 542 and 552 is reduced. In addition, use of the two conductive vias 547a and 547b provide further protection from migration of contaminants from the MEMS device 200 (in FIG. 1) to the driving/control circuitry 300 (in FIG. 1).

In FIG. 5, as further compared to the exemplary embodiments shown in FIGS. 3 and 4, two conductive vias 557a and 557b are provided to electrically interconnect the lowermost interconnecting metal layer 552 and the diffusion region 562. Accordingly, the contact resistance between the lowermost interconnection metal layer 552 and the diffusion region 552 is reduced. In addition, use of the two conductive vias 557a and 557b provide further protection from migration of contaminants from the MEMS device 200 (in FIG. 1) to the driving/control circuitry 300 (in FIG. 1).

Figure 6:
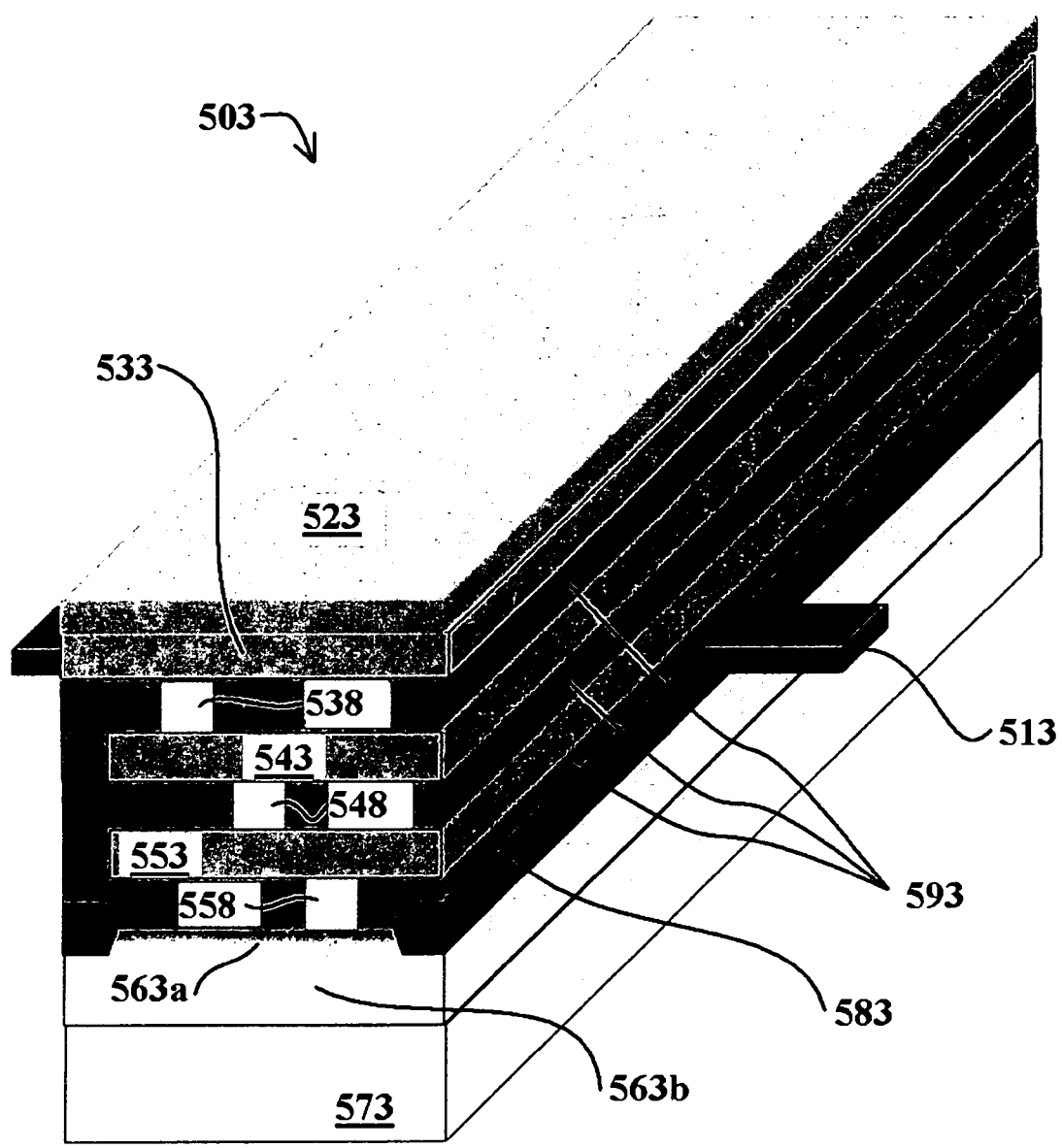
FIG. 6 is a perspective cross sectional view of another exemplary barrier according to the present invention.

FIG. 6 is a perspective cross sectional view of another exemplary barrier according to the present invention. In FIG. 6, a barrier 503 may include a multiple layered structure including interconnecting metal layers 533, 543, and 553, conductive vias 538, 548, and 558, and layers of oxide/nitride material(s) 593 interdispersed between each of the interconnecting metal layers 533, 543, and 553. The barrier 503 further includes a top passivation layer 523, a conductive line 513, and a diffusion region 563a formed within a diffusion well 563b in substrate 573 between field oxide or shallow trench isolation regions 583. Accordingly, the barrier 503, including each of the interconnecting metal layers 533, 543, and 553, the conductive vias 538, 548, and 558, and the diffusion region 563a and the diffusion well 563b is formed as a continuous ring encircling the MEMS device 200 (in FIG. 1). Thus, the barrier 503 prevents contaminants and moisture from migrating into the driving/sensing circuitry 300 from the MEMS device 200 (in FIG. 1) by the environment external to the MEMS device 200 (in FIG. 1), while providing electrical contact to the MEMS device 200 (in FIG. 1) by the conductive line 513 formed to extend through the field oxide region 583, the lowermost one of the oxide/nitride material(s) 593, and through an opening in the lowermost conductive via 558. In addition, the conductive line 513 may be formed of various material(s), such as polysilicon. Furthermore, the passivation layer 520 prevents infiltration of contaminants and moisture into the MEMS device 200 (in FIG. 1) through a thickness of the barrier 503.

In FIG. 6, the diffusion region 563a, as well and the diffusion well 563b may be electrically connected to ground, via the substrate 573, or may be electrically connected to the driving/sensing circuitry 300 (in FIG. 1) via the substrate 573 or via an additional interconnection layer (not shown). Alternatively, the interconnection layers 533, 543, and 553 may be electrically disconnected to the diffusion region 563a by removal of the lowermost conductive via 558. In addition, the diffusion well 563b may be biased according to desired conductivity of the barrier 503.

Figure 7:
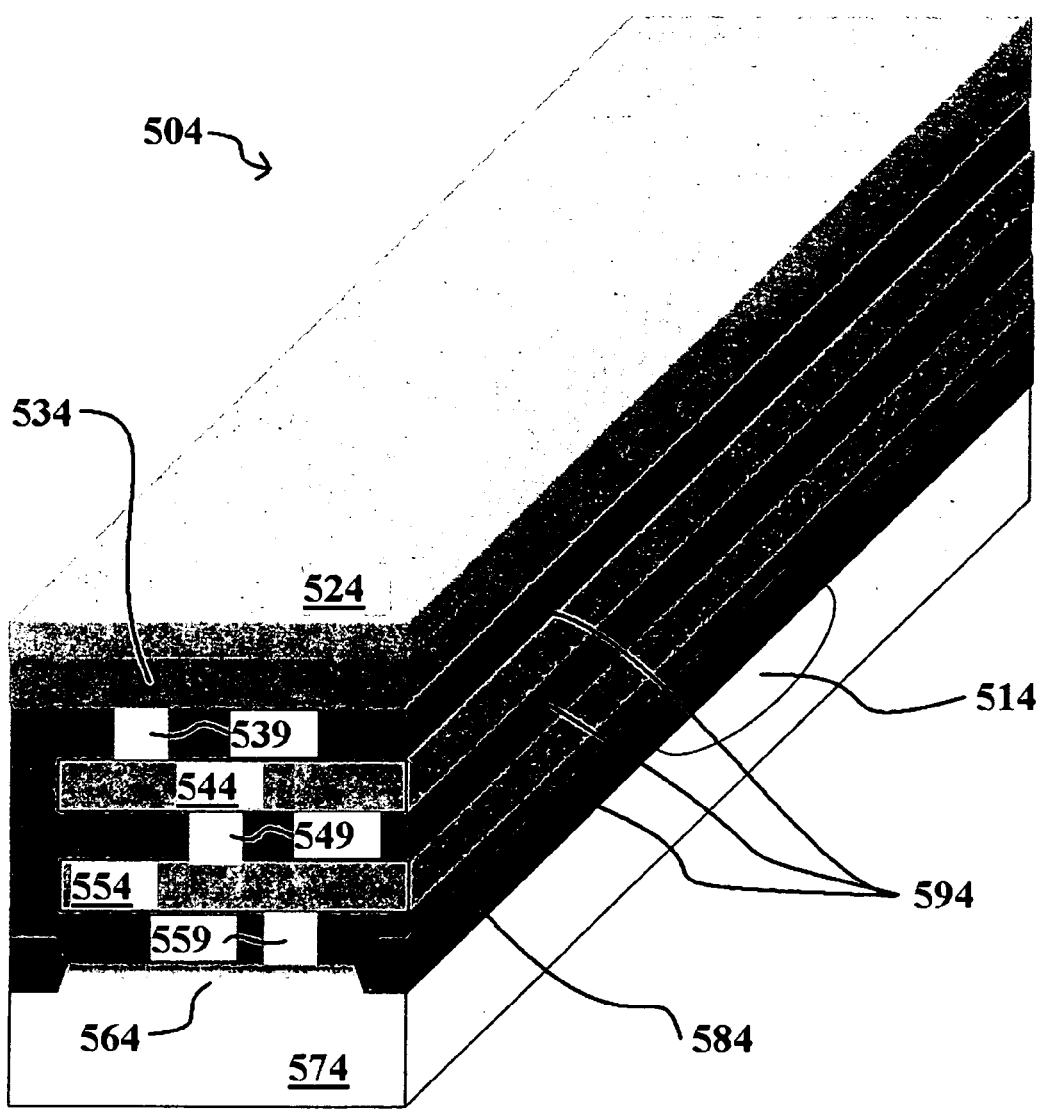
FIG. 7 is perspective cross sectional view of another exemplary barrier according to the present invention.

FIG. 7 is perspective cross sectional view of another exemplary barrier according to the present invention. In FIG. 7, a barrier 504 may include a multiple layered structure including interconnecting metal layers 534, 544, and 554, conductive vias 539, 549, and 559, and layers of oxide/nitride material(s) 594 interdispersed between each of the interconnecting metal layers 534, 544, and 554. The barrier 504 further includes a top passivation layer 524, a first conductive diffusion region 514, and a second diffusion region 564 formed within a substrate 574 between field oxide or shallow trench isolation regions buried oxide regions 584. Accordingly, the barrier 504, including each of the interconnecting metal layers 534, 544, and 554, the conductive vias 539, 549, and 559, and the second diffusion region 564, is formed as a continuous ring encircling the MEMS device 200 (in FIG. 1). Thus, the barrier 504 prevents contaminants and moisture from migrating into the driving/sensing circuitry 300 from the MEMS device 200 (in FIG. 1) by the environment external to the MEMS device 200 (in FIG. 1), while providing electrical contact to the MEMS device 200 (in FIG. 1) by the first diffusion region 514 formed to extend beneath the barrier 504 within the substrate 574. Furthermore, the passivation layer 524 prevents infiltration of contaminants and moisture into the MEMS device 200 (in FIG. 1) through a thickness of the barrier 504.

In FIG. 7, although the first diffusion region 514 is shown as a single diffusion well, various diffusion regions may be formed within the first diffusion region 514, whereby the first diffusion region 514 may function as a well region. Although not shown, the first diffusion region 514 may be contacted by other diffusion regions disposed on opposing sides of the barrier 504. Accordingly, by implementing the first diffusion region 514 to pass beneath the barrier 504, the barrier 504 may be formed as a relatively solid structure without formation of pathways for contaminants to pass from the MEMS device 200 (in FIG. 1) into the driving/sensing circuitry 300 (in FIG. 1).

In FIG. 7, the second diffusion region 564 may be electrically connected to ground, via the substrate 574, or may be electrically connected to the driving/sensing circuitry 300 (in FIG. 1) via the substrate 574 or via an additional interconnection layer (not shown). Alternatively, the interconnection layers 534, 544, and 554 may be electrically disconnected to the second diffusion region 564 by removal of the lowermost conductive via 559.

In FIGS. 3-7, a height of the barriers 500-504 may be determined by a total number of interconnection layers implemented in the driving/sensing circuitry 300 (in FIG. 1). In addition, thicknesses of the oxide/nitride layers 590-594 may be adjusted depending upon the particular region of the barrier 500-504 that the connection line 510-514 is disposed. Furthermore, a width of the barrier 500-504 may be varied depending upon the area between the MEMS device 200 (in FIG. 1) and the driving/sensing circuitry 300 (in FIG. 1), ohmic requirements, and design rules for fabricating the driving/sensing circuitry 300 (in FIG. 1).

In FIGS. 3-7, widths of the conductive vias 535-539, 545-549, and 555-559 may be increased or decreased depending upon contact area, but may have to meet minimum design rules. Similarly, a width of the diffusion regions 560-564 should encompass the full width of the interconnecting metal layers 530-534, 540-544, and 550-554. In addition, the widths of the diffusion regions 560-564 may be varied depending on the design layout of the device 100 (in FIG. 1).

In FIGS. 3-7, each of the barriers 500-504 may be grounded, left electrically floating, i.e., electrically unconnected, electrically connected to the MEMS device 200 (in FIG. 1) or to the driving/sensing circuitry 300 (in FIG. 1). Specifically, the interconnecting metal layers 530-534, 540-544, and 550-554, or any combination thereof, may be electrically grounded, floating, or biased.

In FIG. 3, the opening formed in the uppermost interconnection metal layer 530, or the opening formed in the lowermost interconnection metal layer 551, as shown in FIG. 4, or the opening formed in the uppermost interconnection metal layer 532, as shown in FIG. 5, may all be selected based upon parasitic capacitance of the barriers 500-502. Moreover, the openings of FIGS. 3-5 may be selected depending upon the amount and type of contaminants desired to be blocked, as well as a minimum design rule for fabricating the connection lines 510-512. For example, as shown in FIGS. 3 and 5, placement of the connection lines 510 and 512 above the conductive pathways disposed within the substrates 570 and 572, respectively, may significantly reduce parasitic capacitance from the conductive pathways. Similarly, as shown in FIG. 4, placement of the connection line 511 may significantly reduce parasitic capacitance from conductive pathways disposed above the passivation layer 521. Accordingly, based upon the actual design of the MEMS device 200 (in FIG. 1) and the driving/sensing circuitry 300 (in FIG. 1), as well as additional circuitry and/or devices, combinations of the barriers 500-502 may be implemented to reduce/control parasitic capacitances.

In FIGS. 3-6, a distance between the openings for the connection lines 510-513 and the driving/sensing circuitry 300 (in FIG. 1) may be increased to further reduce migration of contaminants and moisture into the driving/sensing circuitry 300 (in FIG. 1). In addition, the positions of the conductive vias 535-539, 545-549, and 555-559 within the barriers 500-504 must satisfy required design rules without overlapping. Accordingly, the positions of the conductive vias 535-539, 545-549, and 555-559 may be arranged such that a width of the barriers 500-504 may be increased or decreased.

As previously described above, the MEMS device 200, the driving/sensing circuitry 300, and each of the barriers 500-504 may be formed monolithically on a single semiconductor die. In other words, by using CMOS fabrication techniques and processes, the MEMS device 200, the driving/sensing circuitry 300, and the barriers 500-504 may be formed during sequential semiconductor fabrication processing to form a complete device on a single semiconductor die. Accordingly, during fabrication, none of the MEMS device 200, the driving/sensing circuitry 300, and the barriers 500-504 are exposed to environmental contaminants, thereby providing a very efficient fabrication process, as well as a device having reduced exposure to contaminants.

It will be apparent to those skilled in the art that various modifications and variations can be made in the multivariable generator and method using a multivariable generator of the present invention without departing from the spirit or scope of the invention. Thus, it is intended that the present invention cover the modifications and variations of this invention provided they come within the scope of the appended claims and their equivalents.

What is claimed is:

1. An integrated circuit device, comprising:
   a semiconductor die, the semiconductor die including a single semiconductor substrate;
   driving/sensing circuitry disposed along a peripheral region of the semiconductor die;
   a MEMS device disposed within a central region of the semiconductor die; and
   a barrier disposed on the single semiconductor substrate between the driving/sensing circuitry and the MEMS device, to surround the MEMS device,
   wherein the MEMS device senses or produces a pressure differential and is unsealed by the barrier.

2. The integrated circuit device according to claim 1, wherein the barrier prevents contaminants and moisture from migrating from the MEMS device to the driving/sensing circuitry.

3. The integrated circuit device according to claim 1, wherein the MEMS devices includes one of a microphone, a speaker, and a pressure sensor.

4. The integrated circuit device according to claim 1, wherein the barrier includes a plurality of interconnection layers and a plurality of conductive vias encircling the MEMS device.

5. The integrated circuit device according to claim 4, wherein the plurality of interconnection layers and the plurality of conductive vias are electrically connected to the semiconductor substrate by a diffusion region within the semiconductor substrate, the diffusion region surrounding the MEMS device.

6. The integrated circuit device according to claim 4, wherein the plurality of interconnection layers and the plurality of conductive vias are electrically unconnected.

7. The integrated circuit device according to claim 4, wherein the plurality of interconnection layers and the plurality of conductive vias are electrically connected to one of the MEMS device and the driving/sensing circuitry.

8. The integrated circuit device according to claim 4, wherein the barrier includes at least one conductive line electrically interconnecting the MEMS device and the driving/sensing circuitry.

9. The integrated circuit device according to claim 8, wherein the conductive line extends through the barrier at a position perpendicular to barrier.

10. The integrated circuit device according to claim 9, wherein the conductive line extends through the barrier at a position below the plurality of interconnection layers and the plurality of conductive vias.

11. The integrated circuit device according to claim 8, wherein the conductive line passes through the barrier at an uppermost one of the plurality of interconnection layers.

12. The integrated circuit device according to claim 8, wherein the conductive line passes through the barrier at a lowermost one of the plurality of interconnection layers.

13. The integrated circuit device according to claim 8, wherein the conductive line passes through the barrier at a lowermost one of the plurality of conductive vias.

14. The integrated circuit device according to claim 13, wherein the conductive line includes polysilicon.

15. The integrated circuit device according to claim 8, wherein the conductive line passes beneath the barrier through the substrate.

16. The integrated circuit device according to claim 15, wherein the conductive line includes a diffusion region formed in the substrate, the diffusion region surrounding the MEMS device.

17. The integrated circuit device according to claim 4, wherein the plurality of interconnection layers are electrically connected to the semiconductor substrate by a diffusion region within the semiconductor substrate, the diffusion region surrounding the MEMS device.

18. The integrated circuit device according to claim 4, wherein each of the plurality of interconnection layers are connected to an adjacent one of the plurality of interconnection layers by at least one of the plurality of conductive vias.

19. The integrated circuit device according to claim 4, wherein middle and lowermost ones of the plurality of interconnection layers are electrically interconnected by two of the plurality of conductive vias.

20. The integrated circuit device according to claim 4, wherein a lowermost one of the plurality of interconnection layers is electrically connected to a diffusion region of the semiconductor substrate by two of the plurality of conductive vias, the diffusion region surrounding the MEMS device.

21. The integrated circuit device according to claim 4, wherein one of oxide and nitride materials separate the plurality of interconnection layers and the plurality of conductive vias.

22. The integrated circuit device according to claim 1, wherein the barrier is covered with a passivation layer.

23. A method of fabricating an integrated circuit device, comprising:
   forming driving/sensing circuitry disposed along a peripheral region of a semiconductor die, the semiconductor die including a single semiconductor substrate;
   forming a MEMS device within a central region of the semiconductor die; and
   forming a barrier on the single semiconductor substrate between the driving/sensing circuitry and the MEMS device, to surround the MEMS device, the barrier electrically connected to the semiconductor substrate by a diffusion region within the semiconductor substrate, the diffusion region surrounding the MEMS device, wherein the MEMS device senses or produces a pressure differential and is unsealed by the barrier.

24. The method according to claim 23, wherein the barrier prevents contaminants and moisture from migrating from the driving/sensing circuitry to the MEMS device.

25. The method according to claim 23, wherein the MEMS devices includes one of a microphone, a speaker, and a pressure sensor.

26. The method according to claim 23, wherein the forming a barrier includes a formation of a plurality of interconnection layers and a plurality of conductive vias encircling the MEMS device.

27. The method according to claim 26, wherein the plurality of interconnection layers and the plurality of conductive vias are electrically connected to the semiconductor substrate by the diffusion region within the semiconductor substrate.

28. The method according to claim 26, wherein the plurality of interconnection layers and the plurality of conductive vias are electrically unconnected.

29. The method according to claim 26, wherein the plurality of interconnection layers and the plurality of conductive vias are electrically connected to one of the MEMS device and the driving/sensing circuitry.

30. The method according to claim 26, wherein the barrier includes at least one conductive line electrically interconnecting the MEMS device and the driving/sensing circuitry.

31. The method according to claim 30, wherein the conductive line extends through the barrier at a position perpendicular to barrier.

32. The method according to claim 30, wherein the conductive line extends through the barrier at a position below the plurality of interconnection layers and the plurality of conductive vias.

33. The method according to claim 30, wherein the conductive line passes through the barrier at an uppermost one of the plurality of interconnection layers.

34. The method according to claim 30, wherein the conductive line passes through the barrier at a lowermost one of the plurality of interconnection layers.

35. The method according to claim 30, wherein the conductive line passes through the barrier at a lowermost one of the plurality of conductive vias.

36. The method according to claim 35, wherein the conductive line includes polysilicon.

37. The method according to claim 30, wherein the conductive line passes beneath the barrier through the substrate.

38. The method according to claim 37, wherein the conductive line includes the diffusion region formed in the substrate.

39. The method according to claim 26, wherein the plurality of interconnection layers are electrically connected to the semiconductor substrate by the diffusion region within the semiconductor substrate.

40. The method according to claim 26, wherein each of the plurality of interconnection layers are connected to an adjacent one of the plurality of interconnection layers by at least one of the plurality of conductive vias.

41. The method according to claim 26, wherein middle and lowermost ones of the plurality of interconnection layers are electrically interconnected by two of the plurality of conductive vias.

42. The method according to claim 26, wherein a lowermost one of the plurality of interconnection layers is electrically connected to the diffusion region of the semiconductor substrate by two of the plurality of conductive vias.

43. The method according to claim 26, wherein one of oxide and nitride materials separate the plurality of interconnection layers and the plurality of conductive vias.

44. The method according to claim 23, wherein the barrier is covered with a passivation layer.

45. The method according to claim 23, wherein the MEMS device, the driving/sensing circuitry, and the barrier are monolithically formed on the semiconductor die using CMOS fabrication processes.

46. The method according to claim 23, wherein the MEMS device, the driving/sensing circuitry, and the barrier are sequentially formed on the semiconductor die.

47. The integrated circuit device according to claim 1, wherein the MEMS device measures one of a physical, mechanical, and acoustical phenomenon.

48. The integrated circuit device according to claim 1, wherein the MEMS device produces one of a physical, mechanical, and acoustical phenomenon.

49. The method according to claim 23, wherein the MEMS device measures one of a physical, mechanical, and acoustical phenomenon.

50. The method according to claim 23, wherein the MEMS device produces one of a physical, mechanical, and acoustical phenomenon.

51. The integrated circuit device according to claim 1, wherein:
    the MEMS device is disposed on a face of the single semiconductor substrate;
    the barrier includes a plurality of interconnection layers stacked on the face of the single semiconductor substrate, and a plurality of conductive vias extending from the barrier toward the MEMS device in a direction parallel to a direction in which the face of the single semiconductor substrate extends.

52. The integrated circuit device according to claim 1, wherein:
    the barrier includes a diffusion region that electrically connects the barrier to the semiconductor substrate; and
    the barrier, including the diffusion region, is formed as a continuous ring encircling the MEMS device.

\* \* \* \* \*